US011018167B2

(12) United States Patent
Zhao et al.

(10) Patent No.: US 11,018,167 B2
(45) Date of Patent: May 25, 2021

(54) METHOD AND SYSTEM FOR AGING PROCESS ON TRANSISTORS IN A DISPLAY PANEL (71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Ke Zhao, Beijing (CN); Guoqing Zhang, Beijing (CN); Hongwei Gao, Beijing (CN); Xiaowei Wang, Beijing (CN); Zhihui Jia, Beijing (CN); Yan Zong, Beijing (CN); Longfei Yang, Beijing (CN); Hongxia Yang, Beijing (CN); Meili Guo, Beijing (CN); Weifeng Wang, Beijing (CN); Pucha Zhao, Beijing (CN); Zhixin Guo, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 259 days.

(21) Appl. No.: 16/053,460

(22) Filed: Aug. 2, 2018

(65) Prior Publication Data
US 2019/0189651 A1 Jun. 20, 2019

(30) Foreign Application Priority Data
Dec. 15, 2017 (CN) .......................... 201711352725.7

(51) Int. Cl.
*G09G 3/3233* (2016.01)
*H01L 27/32* (2006.01)
(Continued)

(52) U.S. Cl.
CPC ....... *H01L 27/1296* (2013.01); *G09G 3/3233* (2013.01); *H01L 22/20* (2013.01);
(Continued)

(58) Field of Classification Search
CPC ......... H01L 22/00; H01L 22/14; H01L 22/20; H01L 22/22; H01L 22/26; H01L 51/0001;
(Continued)

(56) References Cited

U.S. PATENT DOCUMENTS 8,416,169 B2 * 4/2013 Korenari ............. H01L 27/1214
345/92
8,981,810 B1 * 3/2015 Trimberger .......... H03K 19/003
326/8

(Continued)

*Primary Examiner* — Maliheh Malek
(74) *Attorney, Agent, or Firm* — Dinsmore & Shohl (57) ABSTRACT

The present disclosure relates to a method and system for performing aging process on the transistor in the display panel. A method for performing aging process on a transistor in a display panel, comprising: obtaining an initial characteristic curve of the transistor; determining an initial cutoff voltage range of the transistor according to the obtained initial characteristic curve; determining a gate-source voltage and a drain-source voltage required by the transistor according to the initial cutoff voltage range, so as to increase an cutoff voltage range of the transistor; and performing aging process on the transistor according to the determined required gate-source voltage and drain-source voltage.

12 Claims, 6 Drawing Sheets

(51) Int. Cl.
*H01L 51/56* (2006.01)
*H01L 21/66* (2006.01)
*H01L 27/12* (2006.01)

(52) U.S. Cl.
CPC .......... *H01L 27/3244* (2013.01); *H01L 51/56* (2013.01); *G09G 2300/0819* (2013.01); *G09G 2300/0842* (2013.01); *G09G 2310/0251* (2013.01); *G09G 2310/0262* (2013.01); *H01L 2227/323* (2013.01); *H01L 2251/562* (2013.01)

(58) Field of Classification Search
CPC ................. H01L 51/0508; H01L 51/56; H01L 27/32–3241; H01L 2251/50; H01L 2251/55; H01L 2251/56; H01L 2251/562; G09G 3/3696; G09G 3/342; G09G 3/3426; G09G 3/36–3696; G09G 2330/021–028; G09G 2320/043–048; G09G 2320/06–106
See application file for complete search history.

(56) References Cited

U.S. PATENT DOCUMENTS

| | | | |
|---|---|---|---|
| 9,082,514 B1* | 7/2015 | Trimberger | G11C 29/06 |
| 9,697,767 B2* | 7/2017 | Tan | G09G 3/3233 |
| 10,090,831 B2* | 10/2018 | Wang | G09G 3/006 |
| 10,319,307 B2* | 6/2019 | Chaji | G09G 3/006 |
| 10,586,484 B2* | 3/2020 | Liu | G09G 3/2092 |
| 10,714,506 B2* | 7/2020 | Li | H01L 27/124 |
| 2004/0080309 A1* | 4/2004 | Schmid | G01R 31/2635 |
| | | | 324/756.02 |
| 2005/0168416 A1* | 8/2005 | Hashimoto | G09G 3/3291 |
| | | | 345/76 |
| 2005/0168491 A1* | 8/2005 | Takahara | G09G 3/3241 |
| | | | 345/690 |
| 2005/0184946 A1* | 8/2005 | Pyoun | G09G 3/3688 |
| | | | 345/94 |
| 2006/0027917 A1* | 2/2006 | Wachter | H01L 23/49562 |
| | | | 257/728 |
| 2007/0080905 A1* | 4/2007 | Takahara | G09G 3/3258 |
| | | | 345/76 |
| 2008/0048951 A1* | 2/2008 | Naugler, Jr. | G09G 3/006 |
| | | | 345/82 |
| 2008/0132138 A1* | 6/2008 | Lee | H01L 51/56 |
| | | | 445/24 |
| 2008/0141072 A1* | 6/2008 | Kalgren | G01D 3/08 |
| | | | 714/33 |
| 2008/0169460 A1* | 7/2008 | Yoo | H05B 45/60 |
| | | | 257/40 |
| 2008/0169822 A1* | 7/2008 | Kwak | G09G 3/3208 |
| | | | 324/537 |
| 2008/0186301 A1* | 8/2008 | Park | G09G 3/3233 |
| | | | 345/211 |
| 2008/0225061 A1* | 9/2008 | Kimura | G09G 3/3233 |
| | | | 345/690 |
| 2008/0238953 A1* | 10/2008 | Ogura | G09G 3/3275 |
| | | | 345/697 |
| 2009/0045733 A1* | 2/2009 | Suh | H01L 27/3276 |
| | | | 313/504 |
| 2009/0094013 A1* | 4/2009 | Topaloglu | G06F 30/367 |
| | | | 703/14 |
| 2009/0109142 A1* | 4/2009 | Takahara | G09G 3/006 |
| | | | 345/76 |
| 2009/0219235 A1* | 9/2009 | Yamamoto | G09G 3/3233 |
| | | | 345/80 |
| 2009/0262258 A1* | 10/2009 | Taneda | G09G 3/3208 |
| | | | 348/739 |
| 2009/0295699 A1* | 12/2009 | Korenari | H01L 29/78621 |
| | | | 345/92 |
| 2010/0007386 A1* | 1/2010 | Jinta | G11C 19/184 |
| | | | 327/108 |
| 2010/0155724 A1* | 6/2010 | Hong | H01L 23/60 |
| | | | 257/48 |
| 2012/0098097 A1* | 4/2012 | Felsl | H01L 29/7395 |
| | | | 257/566 |
| 2012/0154453 A1* | 6/2012 | Yamashita | G09G 3/3225 |
| | | | 345/690 |
| 2012/0154682 A1* | 6/2012 | Yamashita | G09G 3/3233 |
| | | | 348/649 |
| 2013/0162617 A1* | 6/2013 | Yoon | G09G 3/3233 |
| | | | 345/211 |
| 2014/0028733 A1* | 1/2014 | Lee | G09G 3/3266 |
| | | | 345/690 |
| 2014/0043316 A1* | 2/2014 | Chaji | G09G 3/3233 |
| | | | 345/212 |
| 2014/0055436 A1* | 2/2014 | Han | G09G 3/3677 |
| | | | 345/211 |
| 2014/0055500 A1* | 2/2014 | Lai | G09G 3/3225 |
| | | | 345/690 |
| 2014/0111567 A1* | 4/2014 | Nathan | G09G 3/3233 |
| | | | 345/694 |
| 2014/0117340 A1* | 5/2014 | Kim | H01L 29/78621 |
| | | | 257/40 |
| 2014/0168186 A1* | 6/2014 | Kang | G09G 3/3648 |
| | | | 345/212 |
| 2014/0253170 A1* | 9/2014 | Lipp | G01R 31/42 |
| | | | 324/762.01 |
| 2014/0285407 A1* | 9/2014 | Chaji | G09G 3/3241 |
| | | | 345/76 |
| 2014/0320544 A1* | 10/2014 | Kim | H01L 27/3262 |
| | | | 345/690 |
| 2015/0049127 A1* | 2/2015 | Masumoto | G09G 3/3225 |
| | | | 345/690 |
| 2015/0255170 A1* | 9/2015 | Liang | G09G 3/3241 |
| | | | 377/75 |
| 2015/0378470 A1* | 12/2015 | Yang | G06F 3/044 |
| | | | 345/174 |
| 2016/0027382 A1* | 1/2016 | Chaji | G09G 3/3233 |
| | | | 345/212 |
| 2016/0055797 A1* | 2/2016 | Tan | G09G 3/3225 |
| | | | 345/206 |
| 2016/0078813 A1* | 3/2016 | Mizukoshi | G09G 3/3291 |
| | | | 345/76 |
| 2016/0202714 A1* | 7/2016 | Luria | H02M 1/088 |
| | | | 713/300 |
| 2016/0275860 A1* | 9/2016 | Wu | G09G 3/006 |
| 2017/0030975 A1* | 2/2017 | Ueno | G01R 31/392 |
| 2017/0103236 A1* | 4/2017 | Homayoun, Jr. | G06F 21/87 |
| 2017/0194964 A1* | 7/2017 | Chen | H03K 19/1774 |
| 2017/0200404 A1* | 7/2017 | Han | G09G 3/3266 |
| 2017/0270869 A1* | 9/2017 | Ma | G09G 3/3266 |
| 2017/0302265 A1* | 10/2017 | Wang | H03K 17/16 |
| 2018/0074100 A1* | 3/2018 | Paiz Gatica | G01R 27/08 |
| 2018/0174640 A1* | 6/2018 | Gupta | G11C 11/4091 |
| 2018/0190177 A1* | 7/2018 | Hung | G09G 3/3233 |
| 2018/0293016 A1* | 10/2018 | Meng | G06F 3/0619 |
| 2019/0012959 A1* | 1/2019 | Wang | G09G 3/3208 |
| 2019/0066570 A1* | 2/2019 | Liu | G09G 3/2092 |
| 2019/0097635 A1* | 3/2019 | Schmit | G06F 30/34 |
| 2019/0147797 A1* | 5/2019 | Yuan | H01L 27/3248 |
| | | | 345/76 |
| 2019/0156752 A1* | 5/2019 | Qian | G09G 3/3258 |
| 2019/0259325 A1* | 8/2019 | Chaji | H04N 9/64 |
| 2019/0259332 A1* | 8/2019 | Xu | G09G 3/3208 |
| 2019/0280066 A1* | 9/2019 | Lin | G09G 3/3233 |
| 2019/0302172 A1* | 10/2019 | Gao | G09G 3/3208 |
| 2019/0318691 A1* | 10/2019 | Soni | G09G 3/3233 |

* cited by examiner

METHOD AND SYSTEM FOR AGING PROCESS ON TRANSISTORS IN A DISPLAY PANEL

CROSS-REFERENCE TO RELATED APPLICATIONS

The present application claims priority to Chinese Patent Application No. 201711352725.7 filed on Dec. 15, 2017, the contents of which are incorporated herein in entirety by reference.

TECHNICAL FIELD

The present disclosure relates to technical field of display technology, and particularly to a method and system for aging process on transistors in a display panel.

BACKGROUND

In the fabrication process of an Organic Light Emitting Diode (OLED) device, is an aging process on a thin film transistor (TFT) in the OLED device is required after the OLED device is formed, which is referred to as TFT-Aging. This process can eliminate bright spots and ensure the stability of TFT characteristics. At the time of performing TFT-Aging process, a large stress is applied to the TFT by applying a fixed voltage value to the OLED device, thereby achieving an aging effect. The aging effect is related to the stress. A moderate stress can improve the yield of OLED devices and improve the stability of TFT characteristics. The current aging effect still needs to be improved.

SUMMARY

According to an aspect of the present disclosure, there is provided a method for performing aging process on a transistor in a display panel, comprising: obtaining an initial characteristic curve of the transistor; determining an initial cutoff voltage range of the transistor according to the obtained initial characteristic curve; determining a gate-source voltage and a drain-source voltage required by the transistor according to the initial cutoff voltage range, so as to increase an cutoff voltage range of the transistor; and performing aging process on the transistor according to the determined required gate-source voltage and drain-source voltage.

In some embodiments of the present disclosure, determining a gate-source voltage and a drain-source voltage required by the transistor according to the initial cutoff voltage range comprises: a) determining a reference cutoff voltage range according to the initial cutoff voltage range; b) determining, with the reference cutoff voltage range as a target cutoff voltage range, a reference gate-source voltage and a reference drain-source voltage required for the transistor to reach the target cut-off voltage range; c) acquiring current characteristic curve of the transistor after applying the reference gate-source voltage and the reference drain-source voltage to the transistor; d) determining whether the obtained current characteristic curve of the transistor satisfies a requirement; e) if the obtained current characteristic curve is of the transistor does not satisfy the requirement, increasing the reference cutoff voltage range, and taking the increased reference cutoff voltage range as the target cutoff voltage range, repeating b)-d); in the case where the current characteristic curve of the transistor satisfies the requirement, the reference gate-source voltage and the reference drain-source voltage when the requirement is satisfied are used as the gate-source voltage and the drain-source voltage required for the transistor.

In some embodiments of the present disclosure, the reference gate-source voltage and the reference drain-source voltage required for the transistor to reach the target cutoff voltage range are determined according to a pre-acquired corresponding relations among gate-source voltage, drain-source voltage and the cutoff voltage range.

In some embodiments of the present disclosure, the requirement is that the gate-source voltage needed for the transistor is within the current cutoff voltage range when the display panel is illuminated.

In some embodiments of the present disclosure, obtaining an initial characteristic curve of the transistor comprises: the initial characteristic curve of the transistor is simulated according to a characteristic test result of the transistor which is obtained in advance.

In some embodiments of the present disclosure, the characteristic test result of the transistor obtained in advance is obtained when the display panel is under an array substrate test.

In some embodiments of the present disclosure, performing aging process on the transistor according to the determined required gate-source voltage and drain-source voltage comprises: determining a gate voltage, a source voltage, and a drain voltage required by the transistor according to the determined gate-source voltage and drain-source voltage required for the transistor; applying the gate voltage, the source voltage, and the drain voltage required by the transistor to the transistor to performing aging process on the transistor.

According to another aspect of the present disclosure, there is provided a system for performing an aging process a transistor in a display panel, comprising: an analysis sub-circuit configured to obtain an initial characteristic curve of the transistor; and to determine an initial cutoff voltage range of the transistor according to the obtained initial characteristic curve; a voltage determining sub-circuit configured to determine a gate-source voltage and a drain-source voltage required by the transistor according to the initial cutoff voltage range, so as to increase an cutoff voltage range of the transistor; and a test sub-circuit configured to perform aging process on the transistor according to the determined required gate-source voltage and drain-source voltage.

In some embodiments of the present disclosure, said voltage determining sub-circuit is configured to: a) determining a corresponding reference cutoff voltage range of the transistor according to the initial cutoff voltage range; b) determining, with the reference cutoff voltage range as a target cutoff voltage range, a reference gate-source voltage and a reference drain-source voltage required for the transistor to reach the target cutoff voltage range; c) obtaining the current characteristic curve of the transistor after applying the reference gate-source voltage and the reference drain-source voltage to the transistor; d) determining whether the obtained current characteristic curve of the transistor satisfies the requirement; e) if the obtained current characteristic curve of the transistor does not satisfy the requirement, increasing the reference cutoff voltage range, and using the increased reference cutoff voltage range as the target cutoff voltage range, repeating steps b)-d); in the case where the current characteristic curve of the transistor satisfies the requirement, the reference gate-source voltage and the reference drain-source voltage when the requirement is satisfied are used as the gate-source voltage and the drain-source voltage required for the transistor.

In some embodiments of the present disclosure, the voltage determining sub-circuit is configured to determine the reference gate-source voltage and the reference drain-source voltage required for the transistor to reach the target cutoff voltage range according to a pre-acquired corresponding relations among gate-source voltage, drain-source voltage and the cutoff voltage range.

In some embodiments of the present disclosure, said requirement is the is gate-source voltage required for the transistor when the display panel is illuminated is within the current cutoff voltage range of the transistor.

In some embodiments of the present disclosure, said analysis subcircuit is configured to: simulate the initial characteristic curve of the transistor according to a characteristic test result of the transistor obtained in advance.

In some embodiments of the present disclosure, the characteristic test result of the transistor obtained in advance is obtained when an array substrate test is performed on the display panel.

In some embodiments of the present disclosure, the test subcircuit is configured to: determine a gate voltage, a source voltage, and a drain voltage required by the transistor according to the determined gate-source voltage and drain-source voltage required for the transistor; and a gate voltage, a source voltage, and a drain voltage required for the transistor are applied to the transistor to performing aging process on the transistor

DETAILED EMBODIMENTS

The present disclosure will be further described in detail with reference to the accompanying drawings, in order to make the purpose, technical solutions and benefits of the present disclosure clearer. Obviously, the described embodiments are merely a part of the embodiments of the present disclosure rather than all the embodiments. Based on the embodiments of the present disclosure, a skilled person in the art may reach all other embodiments without inventive step, and they all belong to the scope of protection of the present disclosure.

The shapes and sizes of the various components in the drawings do not reflect true proportions, and are merely intended to illustrate the present disclosure.

At present, TFT-Aging works by writing a fixed voltage value to the TFT to form a fixed Stress (Vgs and Vds) on the TFT. After multiple debugging, the ideal Aging Stress is finally obtained. The inventors of the present disclosure have found that due to the large dispersion of TFT characteristics of existing products, a single fixed Aging Stress cannot achieve good aging effects for all products, and too large or too small Stress will cause TFT leakage and generate bright spots, and the stability for TFT characteristic cannot be guaranteed.

Figure 1:
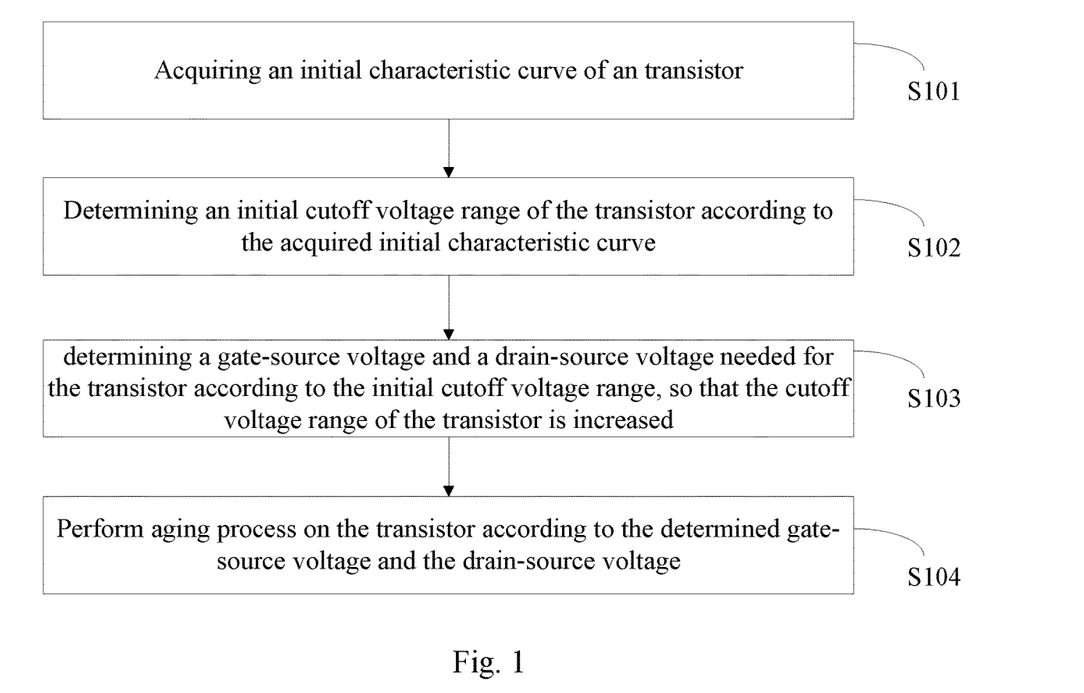
FIG. 1 is a schematic flowchart diagram of an aging process method according to an embodiment of the present disclosure.

A method for aging process on a transistor of a display panel according to an embodiment of the present disclosure, as shown in FIG. 1, includes:

S101: For a transistor that needs to be aged in the display panel, obtain an initial characteristic curve of the transistor;

S102. Determine an initial cutoff voltage range of the transistor according to the obtained initial characteristic curve;

S103. Determine, according to the initial cutoff voltage range, a gate-source voltage and a drain-source voltage required by the transistor to increase a cutoff voltage range of the transistor;

S104. Perform aging process on the transistors in the display panel that need to is be aged according to the determined gate-source voltage and drain-source voltage required for each transistor.

In the method for aging process on the transistor provided by the embodiment of the present disclosure, the initial cutoff voltage range of the transistor is determined according to the initial characteristic curve of the transistor that needs to be aged in the display panel; the gate-source voltage and drain-source voltage required by the transistor are determined according to the initial cutoff voltage range, in order to increase the cutoff voltage range of the transistor; the transistors in the display panel that need to be aged are aged according to the determined gate-source voltage and drain-source voltage required for each transistor. In this method, since the voltages for the aging process applied to each display panel are obtained according to the transistor in the display panel, the effect for the aging process is good, and the process yield and the stability of the TFT characteristics of the product can be effectively ensured.

It should be understood that the characteristic curve of the transistor described in the present disclosure refers to a relationship between the drain current Id and the gate voltage Vg of the transistor.

Specifically, the purpose of the aging process of the transistor is to eliminate the bright spot caused by the leakage of the transistor. The principle of the aging process of the transistor is to use a relatively large voltage to stimulate the transistor to shift its characteristics, so as to delay the upward region (leakage region) of the Id-Vg curve, thereby achieving the effect of eliminating bright spots and ensuring stable TFT characteristics.

Figure 2:
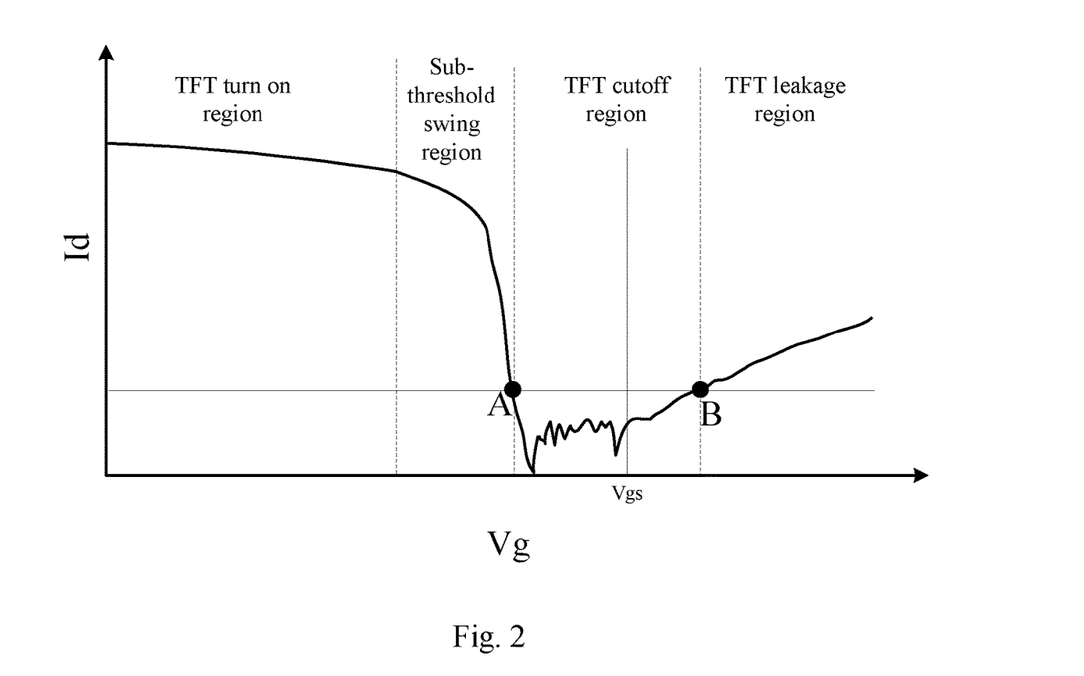
FIG. 2 is a schematic diagram of an Id-Vg curve of a transistor according to an embodiment of the present disclosure.

Specifically, the Id-Vg curve of the transistor is as shown in FIG. 2. The abscissa indicates the gate voltage Vg, the ordinate indicates the drain current Id, the point A indicates the forward threshold voltage, and the point B indicates the negative threshold voltage. If the gate-source voltage Vgs required for the transistor when the display panel is lit is located in the TFT cut-off region, it is indicated that the bright spot can be eliminated. Conversely, if Vgs is not in the TFT cutoff area, the bright spots cannot be completely eliminated.

Figure 3:
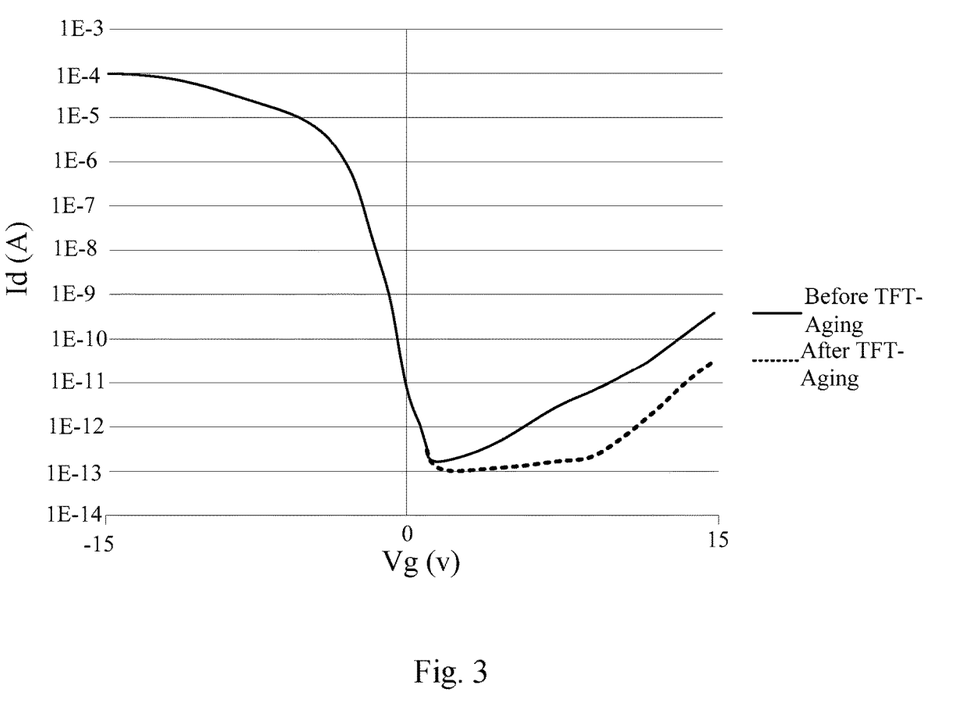
FIG. 3 is a schematic diagram of Id-Vg curves before and after TFT-Aging according to an embodiment of the present disclosure.

The Id-Vg curves before and after TFT-Aging are shown in FIG. 3. After TFT-Aging, the negative threshold voltage and the cutoff voltage range can be made as large as possible.

Figure 4:
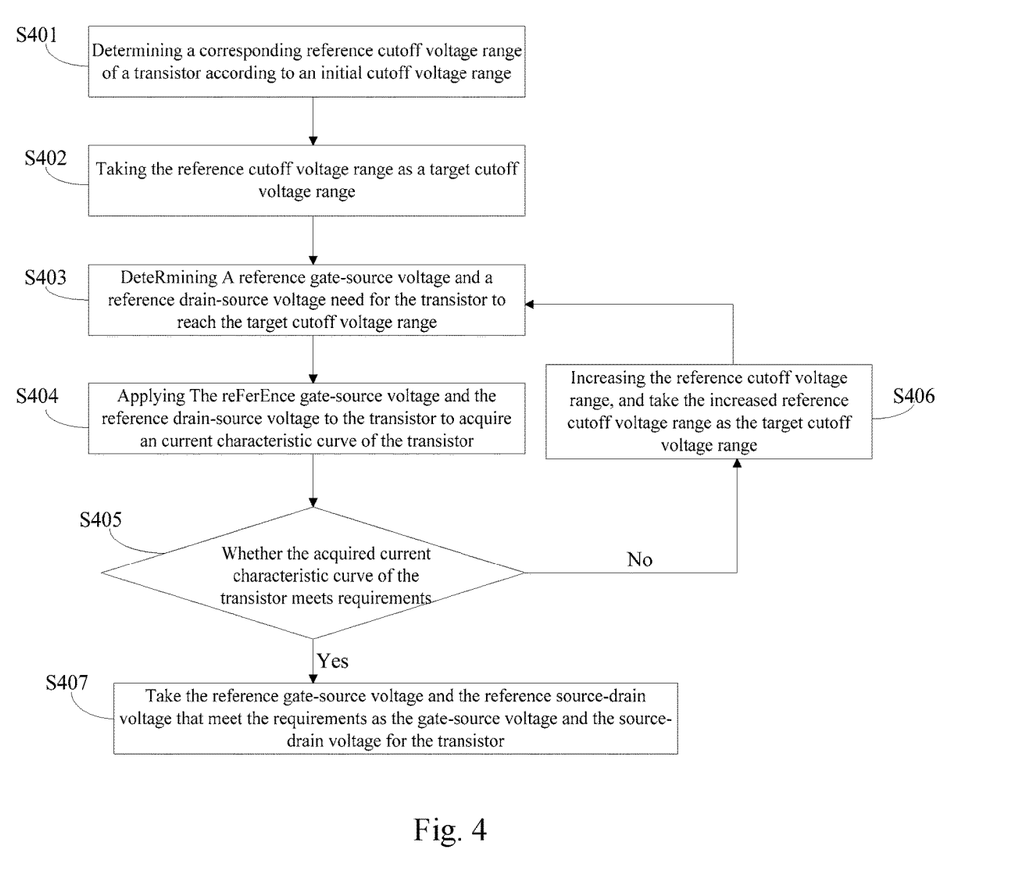
FIG. 4 is a schematic flow chart of determining a gate-source voltage and a drain-source voltage required for a transistor in the aging process method according to an embodiment of the present disclosure.

Optionally, in the aging processing method provided by the embodiment of the present disclosure, determining a gate-source voltage and a drain-source voltage required by the transistor according to the initial cut-off voltage range, as shown in FIG. 4, specifically includes:

S401: determine a reference cutoff voltage range corresponding to the transistor according to the initial cutoff voltage range;

S402, taking the reference cutoff voltage range as a target cutoff voltage range;

S403. determine a reference gate-source voltage and a reference drain-source voltage required for the transistor to reach the target cutoff voltage range;

S404. apply the reference gate-source voltage and the reference drain-source voltage to the transistor to obtain a current characteristic curve of the transistor.

S405. determine whether a current characteristic curve of the obtained transistor meets the requirement;

S406. If the current characteristic curve of the obtained transistor does not meet the requirement, increase the reference cutoff voltage range, and use the increased reference cutoff voltage range as the target cutoff voltage range;

Repeat steps S403 to S405 until the current characteristic curve of the transistor meets the requirements;

S407. The reference gate-source voltage and the reference drain-source voltage when the requirement is satisfied are used as a gate-source voltage and a drain-source voltage required by the transistor.

Specifically, at present, TFT-Aging obtains the aging voltage by debugging in batches. Generally, for the same model of products, a batch of products is selected for testing. If the test result is not good, another batch of products are selected for testing according to the test results. After multiple times of debugging, the ideal Aging Stress is finally acquired, and the finally ideal Stress is adopted to perform TFT-Aging on all products of the same model. Due to the large dispersion of TFT is characteristics of the product, a single fixed Aging Stress can not achieve good aging effect for all products. Stress being too large and too small will both cause TFT leakage, generating bright spots and can not guarantee the stability of TFT characteristics. Also, a lot of manpower, test samples and test time are required.

Figure 5A:
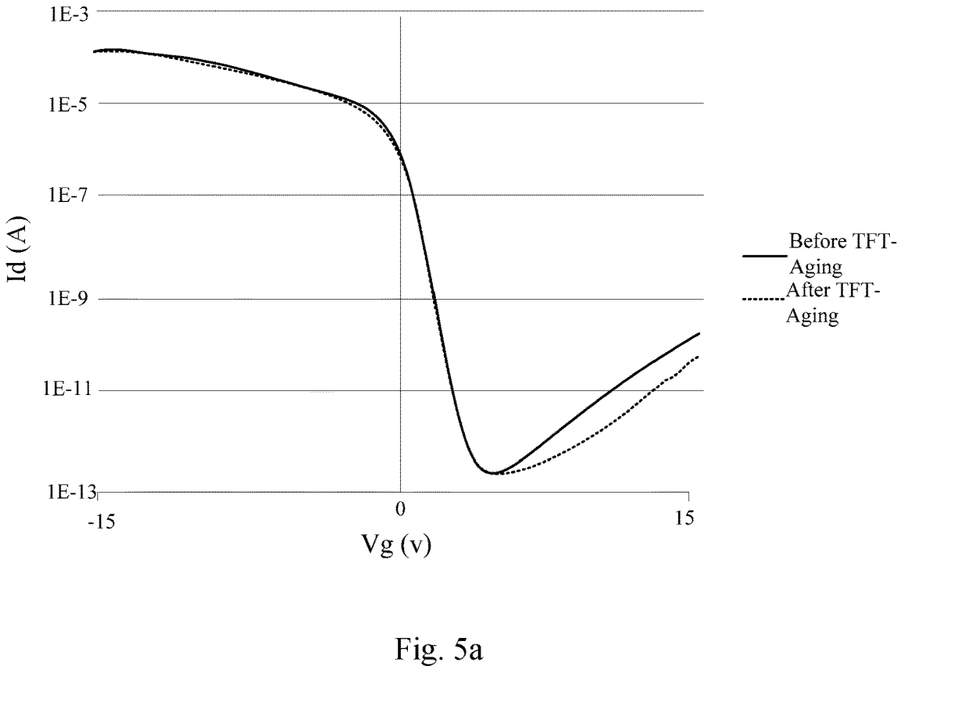
FIGS. 5a to 5c are schematic diagrams of Id-Vg curves before and after TFT-Aging using different Stress.
Figure 5B:
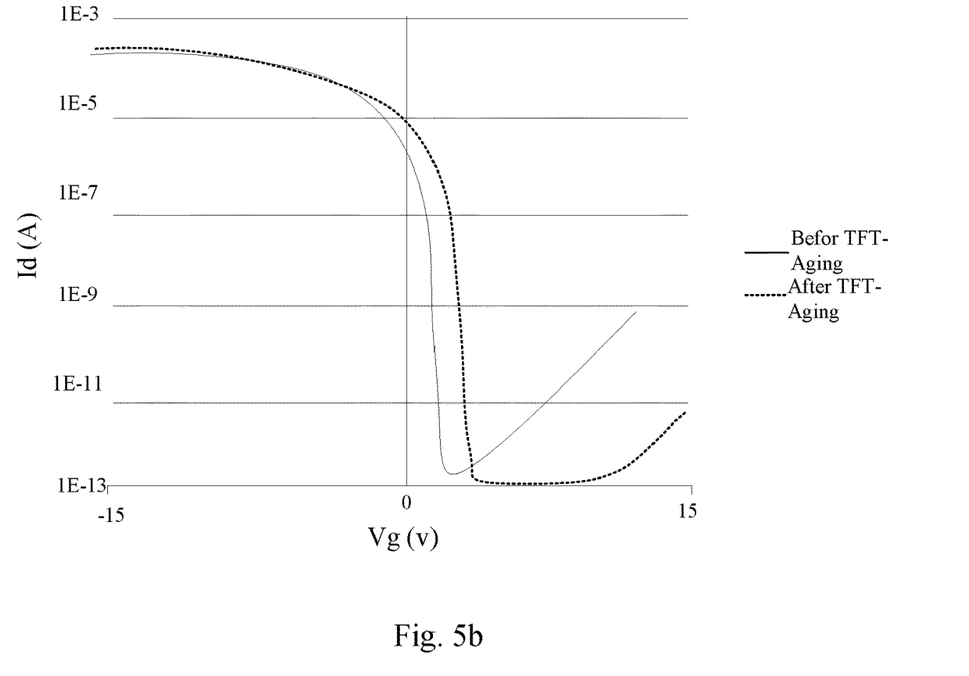
Figure 5C:
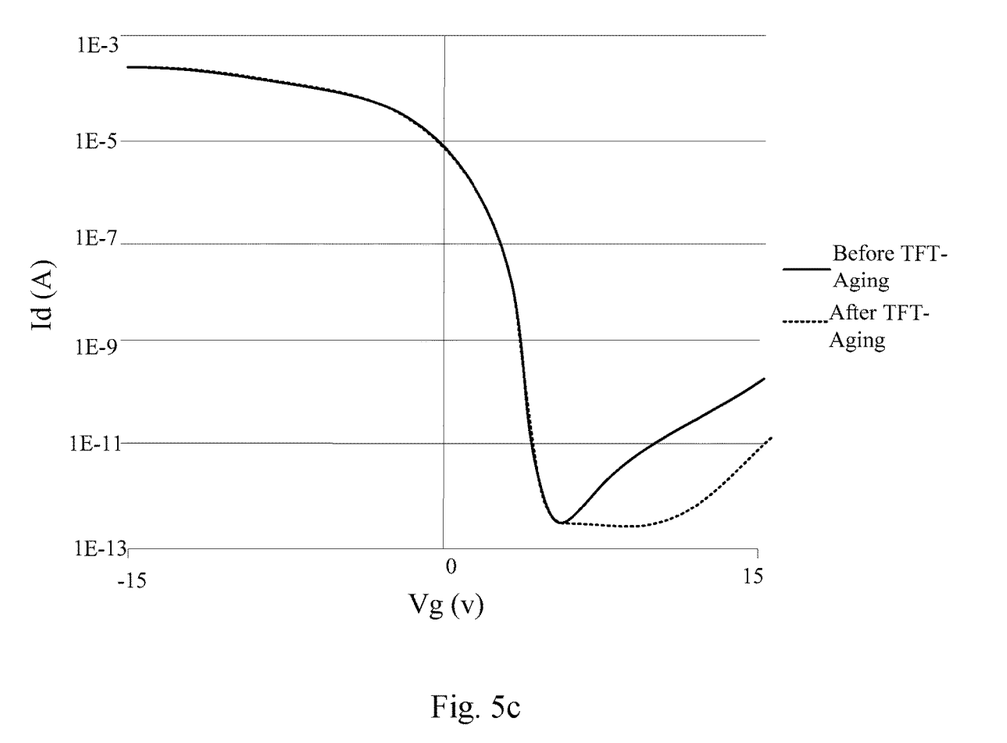

Specifically, the Id-Vg curve before and after TFT-Aging using an inappropriate Stress is shown in FIG. 5a and FIG. 5b, wherein FIG. 5a is an Id-Vg curve when Stress is insufficient, and FIG. 5b is an Id-Vg curve when Stress is excessive. Correspondingly, the Id-Vg curve before and after TFT-Aging using a suitable Stress is shown in FIG. 5c.

In the aging process method provided by the embodiment of the present disclosure, the reference cutoff voltage range can be obtained according to the data obtained by prior aging process method. Taking a transistor as an example, when the initial cutoff voltage range is within a certain range, the corresponding target cutoff voltage range after the aging process is counted. According to the counting result, i.e. the empirical values, a cutoff voltage range may be roughly determined as the reference cutoff voltage range. With the reference cutoff voltage range as the debugging range, the reference cutoff voltage range is gradually increased to finally obtain the target cutoff voltage range. Thus, when Aging Stress is obtained, debugging is started from a value close to the target cutoff voltage range, so that the debugging time can be greatly shortened.

Optionally, in the aging process method provided by the embodiment of the present disclosure, determining a reference gate-source voltage and a reference drain-source voltage required for a transistor to reach a target cutoff voltage range according to a correspondence relationship among a gate-source voltage, a drain-source voltage, and an cutoff voltage range obtained in advance.

Specifically, in the aging process method provided by the embodiment of the present disclosure, the data obtained by the prior aging process method can be used. For example, during the debugging process, the cutoff voltage range has a changing trend with the change of the Stress. A large Vgs can make the negative threshold voltage smaller, the forward threshold voltage becomes larger, that is, the cutoff voltage range becomes larger. A small Vgs can increase the negative threshold voltage, and the forward threshold voltage becomes smaller, that is, the cutoff voltage range becomes smaller. When each time the ideal cutoff voltage range is obtained, the corresponding Stress is Vgs and Vds. Therefore, according to these data, a correspondence table among the gate-source voltage, the drain-source voltage and the cut-off voltage range of the transistor can be obtained. The target gate-source voltage and target drain-source voltage required for the transistor to reach the target cut-off voltage range can be obtained by looking up the table.

Optionally, in the aging process method provided by the embodiment of the present disclosure, determining whether the current characteristic curve of the acquired transistor meets the requirement specifically includes:

Determining whether the gate-source voltage required for the transistor when lighting the display panel is within the current cut-off voltage range of the transistor;

If yes, the requirements are met;

If not, the requirements are not met.

The gate-source voltage Vgs required for the transistor when lighting the display panel is a fixed value. As shown in FIG. 2, if Vgs is located in the TFT cut-off region, it indicates that no bright spot exists, and the requirements are satisfied. On the other hand, if Vgs is not in the TFT cut-off region, it means that the bright spots cannot be completely eliminated, and the requirements are not satisfied.

Optionally, in the aging process method provided by the embodiment of the present disclosure, obtaining a characteristic curve of the transistor specifically includes:

The characteristic curve of the transistor is simulated according to the characteristic test result of the transistor obtained in advance.

Optionally, in the aging process method provided by the embodiment of the present disclosure, the pre-acquired characteristic test result of the transistor is obtained when the display panel is tested on the array substrate.

In a specific implementation, the characteristic test results of the transistors is obtained when the array substrate in the OLED display panel is under array substrate test may be utilized, and the corresponding characteristic curves of the transistors are simulated according to the characteristic test results of the transistors, as the Id-Vg curve shown in FIG. 2, for example.

Specifically, the array substrate test mainly tests electrical parameters (such as turn-on voltage, cut-off voltage, threshold voltage, mobility, etc.) of transistors in the array substrate to evaluate electrical characteristics of the array substrate.

Optionally, in the aging process method provided by the embodiment of the present disclosure, according to the determined gate voltage, the source voltage, and the drain voltage required for each transistor, the transistor that needs to be aged in the display panel is subjected to aging process which includes:

Applying the gate voltage, the source voltage, and the drain voltage required for each transistor to the corresponding transistors according to the determined gate voltage, source voltage, and drain voltage required for each transistor, to perform aging process on the transistors that needs to perform aging process.

Figure 6:
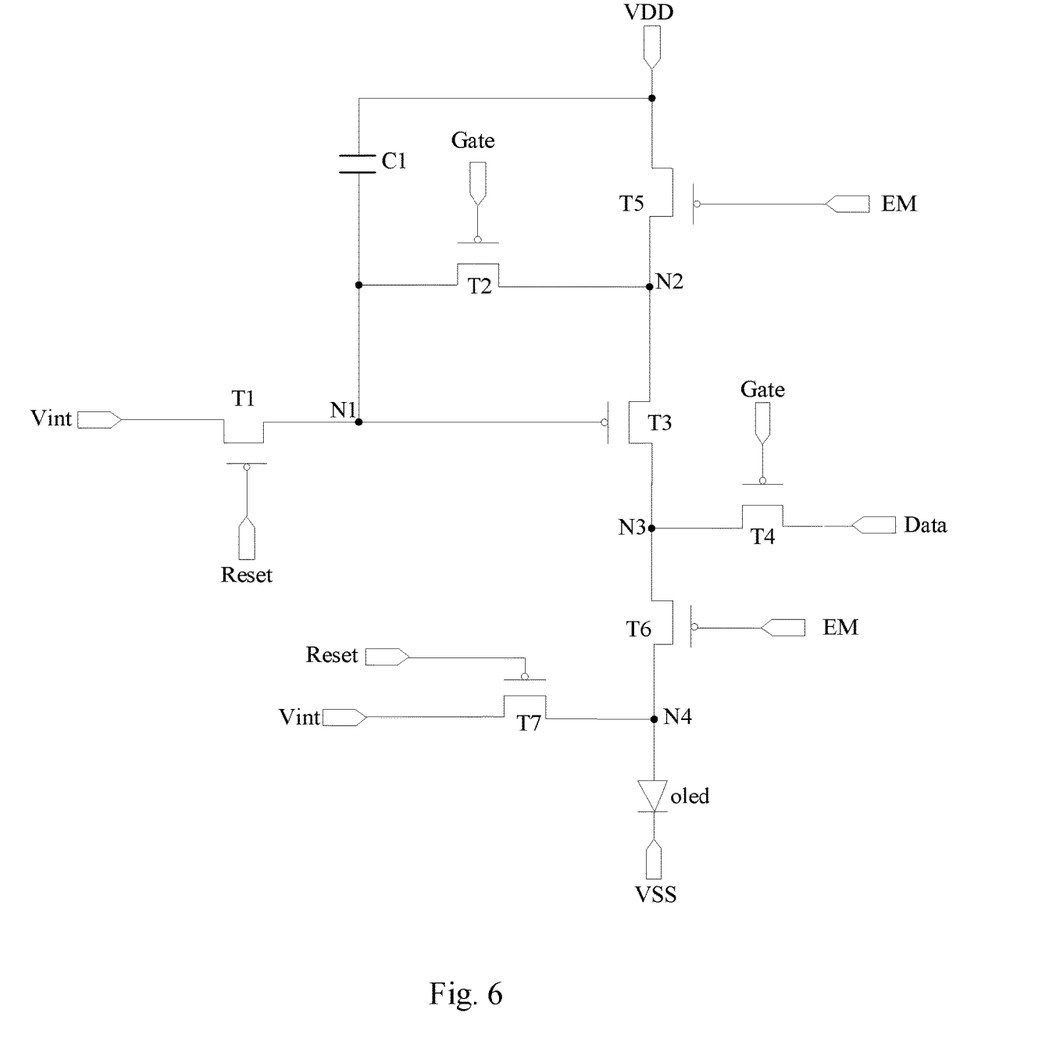
FIG. 6 is a schematic structural diagram of a pixel circuit according to an embodiment of the present disclosure.

The aging method provided by the embodiment of the present disclosure is described below with an example of the OLED display panel used in a wristband. The pixel circuit in the wristband is as shown in FIG. 6, and includes seven transistors T1~T7. For example, seven transistors in the pixel circuit of the OLED display panel need to be aged.

Step 1: Using the characteristic test results of the transistors obtained by performing the array substrate test on the array substrate in the OLED display panel, the initial Id-Vg curve corresponding to each transistor is simulated according to the characteristic test results of the transistors.

Step 2: Determine an initial cutoff voltage range of the transistor according to the obtained initial Id-Vg curve.

Specifically, the initial cutoff voltage range of the transistor is determined based on the forward threshold voltage and the negative threshold voltage in the initial Id-Vg curve.

Step 3: determining a reference cutoff voltage range corresponding to an initial cutoff voltage range of each transistor according to an empirical value;

Step 4: taking the reference cutoff voltage range as the target cutoff voltage range, and determining a reference gate-source voltage and reference drain-source voltage required for each transistor to reach the target cutoff voltage range according to the corresponding relationship among the gate-source voltage, the drain-source voltage, and the cutoff voltage range obtained in advance;

Step 5: applying a reference gate-source voltage and a reference drain-source voltage to the transistor to obtain a current Id-Vg curve of the transistor;

Step 6: determining, by the current Id-Vg curve, whether the gate-source voltage required for the transistor when lighting the display panel is within the current cut-off voltage range of the transistor;

If within the current cut-off voltage range of the transistor, the reference gate-source voltage and the reference drain-source voltage at this time serve as the gate-source voltage and drain-source voltage required for the transistor. Based on the determined gate-source voltage and drain-source voltage required for each transistor, gate voltage, source voltage, and drain voltage required for each transistor are determined. The gate voltage, source voltage, and drain voltage required for each transistor are applied to corresponding transistors to perform aging process on the transistors that need aging.

If it is not within the current cutoff voltage range of the transistor, the reference cutoff voltage range is increased, and steps 4 to 6 are repeated after the increased reference cutoff voltage range is served as the target cutoff voltage range, until the it is determined according to current Id-Vg curve, that the gate-source voltage required by the transistor when the display panel is lit is within the current cut-off voltage range. And the reference gate-source voltage and the reference drain-source voltage at this time are used as the gate-source voltage and the drain-source voltage required for the transistor. According to the required gate-source voltage and drain-source voltage, the gate voltage, source voltage, and drain voltage required for each transistor is determined. the gate voltage, source voltage, and drain voltage required for each transistor are applied to the corresponding transistor, so that the is transistors that need to be aged are subjected to aging process.

In a specific implementation, after the gate voltage, the source voltage, and the drain voltage required by the transistors in FIG. 6 are acquired according to the embodiment of the present disclosure, the voltages of the signal terminals of the pixel circuit need to be determined according to the specific structure of the pixel circuit, thereby The required Stress, Vgs and Vds, can be applied to each transistor when the display panel is aged. The method of determining the voltage of each signal terminal of the pixel circuit according to the gate voltage, the source voltage, and the drain voltage required for each transistor is specifically the same as the prior method, and will not be described in detail herein.

Specifically, when the display panel performs the aging process, the aging stages of different transistors in the pixel circuit are different, and the aging process stage of the transistor is performed when the transistor is in the cutoff state. Taking the pixel circuit in FIG. 6 as an example, the pixel circuit undergoes a reset phase, a data writing phase, and a light emitting control phase during the aging process, wherein T2 performs aging processing in the reset phase, T5 and T6 perform aging processing in the data writing phase, T3 and T4 perform aging processing in the data writing phase and the light emitting control phase, and T1 and T7 perform aging processing in the data writing phase and the light emitting control phase.

Specifically, in the pixel circuit shown in FIG. 6, the gate-source voltage Vgs and the drain-source voltage Vds corresponding to the respective transistors are as shown in Table 1 below.

TABLE 1

| Calculation formulas for gate-source voltage and drain-source voltage of the transistors | | | | | | | |
|---|---|---|---|---|---|---|---|
| | T1 | T2 | T3 | T4 | T5 | T6 | T7 |
| Vgs | CLK-Vint | CLK-N2 | N1-N2 | CLK-Data | CLK-VDD | CLK-N3 | CLK-N4 |
| Vds | N1-Vint | N1-N2 | N3-N2 | N3-Data | N2-VDD | N4-N3 | Vint-N4 |

Specifically, in each stage of the pixel circuit, the potentials of nodes N1 to N4 are as shown in Table 2 below.

TABLE 2

| Potential of nodes N1~N4 of the pixel circuit in each stage | | | | |
|---|---|---|---|---|
| | N1 | N2 | N3 | N4 |
| Reset phase | Vint | 0 | 0 | Vint |
| Data writing phase | Data + Vth | Data + Vth | Data | VSS |
| Light emitting control phase | Data + Vth | VDD | VSS − Vth | VSS |

For example, according to the gate voltage, the source voltage, and the drain is voltage required for each transistor obtained by the aging process method provided by the embodiment of the present disclosure, those skilled in the art can derive the voltages that need to be input to the respective signal terminals of the pixel circuit as Table 3 shows.

TABLE 3

Voltages corresponding to the signal terminals of the pixel circuit

| CLK | VGH | VGL | Vint | Data | VDD | VSS |
|---|---|---|---|---|---|---|
| 10/−7 | 10 | −15 | −4 | 10 | 3 | −15 |

Here, in Table 3, VGH represents a voltage when a Gate, EM, or Reset is at a high potential, and VGL represents a voltage when a Gate, EM, or Reset is at a low potential.

When the display panel is being aged, voltages are input to the respective signal terminals of the pixel circuit according to the voltages in Table 3, so that the Stress of the respective transistors in the reset phase, the data writing phase, and the light-emitting phase are as shown in Table 4 below.

TABLE 4

Voltages of the transistors of the pixel circuit at different phases

| | | T1 | T2 | T3 | T4 | T5 | T6 | T7 |
|---|---|---|---|---|---|---|---|---|
| Reset phase | Vg | −7 | 10 | −4 | 10 | 10 | 10 | −7 |
| | Vd | −4 | −4 | 0 | 0 | 0 | −4 | −4 |
| | Vs | −4 | 0 | 0 | 10 | 3 | 0 | −4 |
| | Vgs | −3 | 10 | −4 | 0 | 7 | 10 | −3 |
| | Vds | 0 | −4 | 0 | −10 | −3 | −4 | 0 |
| Data writing phase | Vg | 10 | −7 | 8.7 | −7 | 10 | 10 | 10 |
| | Vd | −4 | 8.7 | 8.7 | 10 | 8.7 | 0 | −4 |
| | Vs | 8.7 | 8.7 | 10 | 10 | 3 | 10 | 0 |
| | Vgs | 1.3 | −15.7 | −1.3 | −17 | 7 | 0 | 10 |
| | Vds | −12.7 | 0 | −1.3 | 0 | 5.7 | −10 | −4 |
| Light emitting control phase | Vg | 10 | 10 | 8.7 | 10 | −7 | −7 | 10 |
| | Vd | −4 | 8.7 | −15 | −15 | 3 | −15 | −15 |
| | Vs | 8.7 | 3 | 3 | 3 | 3 | −15 | −4 |
| | Vgs | 1.3 | 7 | 5.7 | 7 | −10 | 8 | 14 |
| | Vds | −12.5 | 5.7 | −18 | −18 | 0 | 0 | −11 |

Based on the same concept, the embodiment of the present disclosure further provides an aging process system applied to a display panel. Since principle of the aging process system for solving the problem is similar to the foregoing aging process method, the implementation of the aging process system can be referred to the implementation of the method. The same parts will not be repeated.

Figure 7:
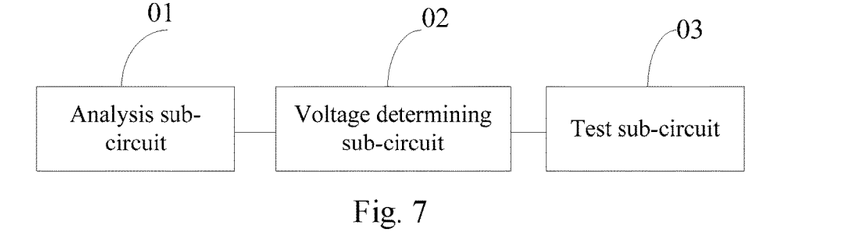
FIG. 7 is a schematic structural diagram of an aging process system according to an embodiment of the present disclosure.

Specifically, an aging process system applied to a display panel according to an embodiment of the present disclosure, as shown in FIG. 7, includes:

an analysis sub-circuit 01 is configured to acquire, for a transistor that needs to be aged in the display panel, an initial characteristic curve of the transistor; and determine an initial cut-off voltage range of the transistor according to the obtained initial characteristic curve;

a voltage determining sub-circuit 02 is configured to determine a gate-source voltage and a drain-source voltage required by the transistor according to the initial cut-off voltage range to increase the cut-off voltage range of the transistor;

a test sub-circuit 03 is configured to perform aging process on the transistors in the display panel that need to be aged according to the determined gate-source voltage and drain-source voltage required for each transistor.

In the above aging process system provided by the embodiment of the present disclosure, the analysis sub-circuit is configured to determine an initial cut-off voltage range of the transistor according to an initial characteristic curve of the transistor in the display panel that needs to be aged; the voltage determining sub-circuit is used to determine, according to the initial cut-off voltage range, the gate-source voltage and drain-source voltage required by the transistor, so as to increase the cutoff voltage range of the transistor; the test sub-circuit is used to perform aging process on the transistors that need to be aged according to the determined gate-source voltage and drain-source voltage required by the transistors. In this method, since the aging process voltage applied to each display panel is obtained according to the transistors in the display panel, the effect after the aging process is good, and the process yield and the stability of the TFT characteristics of the product can be effectively ensured.

Optionally, in the aging process system provided by the embodiment of the present disclosure, the voltage determining sub-circuit is specifically configured to:

determine a reference cutoff voltage range corresponding to the transistor according to the initial cutoff voltage range;

taking the reference cutoff voltage range as the target cutoff voltage range, determine the reference gate source voltage and the reference drain source voltage required for the transistor to reach the target cutoff voltage range;

Apply the reference gate-source voltage and the reference drain-source voltage to the transistor to obtain a current characteristic curve of the transistor;

determine whether the current characteristic curve of the obtained transistor meets the requirements;

if the obtained current characteristic curve of the transistor does not meet the requirement, the reference cutoff voltage range is increased, and the increased reference cutoff voltage range is taken as the target cutoff voltage range;

Until the current characteristic curve of the transistor meets the requirements, the reference gate-source voltage and the reference drain-source voltage when the requirements are met are used as the gate-source voltage and the drain-source voltage required for the transistor.

Optionally, in the aging process system provided by the embodiment of the present disclosure, the voltage determining sub-circuit is configured to determine, according to the correspondence among the pre-acquired gate-source voltage, the drain-source voltage, and the cutoff voltage range, the required reference gate-source voltage and the reference drain-source voltage if the transistor is to reach the target cut-off voltage range.

Optionally, in the aging process system provided by the embodiment of the present disclosure, the voltage determining sub-circuit is configured to determine whether the current characteristic curve of the acquired transistor meets the requirement, specifically:

Determining whether the gate-source voltage required for the transistor when lighting the display panel is within the current cut-off voltage range of the transistor;

If yes, the requirements are met;

If not, the requirements are not met.

Optionally, in the aging process system provided by the embodiment of the present disclosure, the analysis sub-circuit is specifically configured to:

Simulate the initial characteristic curve of the transistor based on the characteristic test result of the transistor obtained in advance.

Optionally, in the aging process system provided by the embodiment of the present disclosure, the pre-acquired characteristic test result of the transistor is obtained when the display panel is tested on the array substrate.

Optionally, in the aging process system provided by the embodiment of the present disclosure, the test sub-circuit is specifically configured to:

Determining a gate voltage, a source voltage, and a drain voltage required for each transistor according to the determined gate-source voltage and drain-source voltage required for each transistor;

The gate voltage, the source voltage, and the drain voltage required for each transistor are applied to corresponding transistors to age the transistors that need to is be aged.

The present disclosure provides an aging process method and an aging process system applied to a display panel according to an embodiment of the present disclosure. Determining an initial cutoff voltage range of a transistor according to an initial characteristic curve of the transistor that needs to be aged in a display panel; according to an initial cutoff voltage range, determining the gate-source voltage and the drain-source voltage required by the transistor to increase the cutoff-voltage range of the transistor; and performing the aging process on transistors in the display panel that needs to be aged according to the determined gate-source voltage and drain-source voltage required by the transistors. In this method, since the aging processing voltage applied to each display panel is obtained according to the transistor in the display panel, the effect after the aging process is good, and the process yield and the stability of the TFT characteristics of the product can be effectively ensured.

Those skilled in the art will appreciate that embodiments of the present disclosure can be provided as a method, system, or computer program product. Accordingly, the present disclosure may take the form of an entirely hardware embodiment, an entirely software embodiment, or a combination of software and hardware aspects. Moreover, the present disclosure may take the form of a computer program product embodied on one or more computer-usable storage media (including but not limited to magnetic disk storage, CD-ROM, optical storage, etc.) including computer usable program code.

The present disclosure is described with reference to flowchart and/or block diagram of methods, apparatus (system), and computer program products according to embodiments of the present disclosure. It will be understood that each flow and/or block of the flowchart and/or block diagram and a combination thereof may be realized by computer program instructions. These computer program instructions can be provided to a processor of a general purpose computer, a dedicated computer, an embedded processing machine, or other programmable data processing device to produce a machine, so that the execution of instructions by a processor of a is computer or other programmable data processing device can generate an apparatus for implementing the functions specified in one or more flows of the flowchart or in a block or blocks of the block diagram.

The computer program instructions can also be stored in a computer readable storage device that can direct a computer or other programmable data processing device to operate in a particular manner, such that the instructions stored in the computer readable storage device may generate a product comprising the instruction device. The instruction device implements the functions specified in one or more flow of the flow chart and/or one or more blocks of the block diagram.

These computer program instructions can also be loaded onto a computer or other programmable data processing device such that a series of operational steps are performed on a computer or other programmable device to produce computer-implemented processing, so that instructions for execution on a computer or other programmable device provide steps for implementing the functions specified in one or more flow of a flowchart and/or one or more blocks of a block diagram.

While the preferred embodiment of the present disclosure has been described, it will be apparent to those skilled in the art to make additional alteration and modification. Therefore, it is intended that the appended claims be interpreted as including the preferred embodiments and all modifications and alterations within the range of the present disclosure.

It will be apparent to those skilled in the art that various modifications and changes can be made in the present disclosure without departing from the spirit and scope of the disclosure. Thus, it is intended that the present invention cover the modifications and changes if the modification and changes of the present disclosure are within the scope of claims of the present disclosure and the equivalent thereof.

We claim:

1. A method for performing aging process on a transistor in a display panel, comprising:

obtaining an initial characteristic curve of the transistor;

determining an initial cutoff voltage range of the transistor according to the obtained initial characteristic curve;

determining a gate-source voltage and a drain-source voltage required by the transistor according to the initial cutoff voltage range, so as to increase an cutoff voltage range of the transistor; and     performing aging process on the transistor according to the determined required gate-source voltage and drain-source voltage,     wherein determining the gate-source voltage and the drain-source voltage required by the transistor according to the initial cutoff voltage range comprises:

a) determining a reference cutoff voltage range according to the initial cutoff voltage range;

b) determining, with the reference cutoff voltage range as a target cutoff voltage range, a reference gate-source voltage and a reference drain-source voltage required for the transistor to reach the target cut-off voltage range;

c) acquiring current characteristic curve of the transistor after applying the reference gate-source voltage and the reference drain-source voltage to the transistor;

d) determining whether the obtained current characteristic curve of the transistor satisfies a requirement;

e) if the obtained current characteristic curve of the transistor does not satisfy the requirement, increasing the reference cutoff voltage range, and taking the increased reference cutoff voltage range as the target cutoff voltage range, repeating b)-d);

in the case where the current characteristic curve of the transistor satisfies the requirement, the reference gate-source voltage and the reference drain-source voltage when the requirement is satisfied are used as the gate-source voltage and the drain-source voltage required for the transistor.

2. The method according to claim 1, wherein the reference gate-source voltage and the reference drain-source voltage required for the transistor to reach the target cutoff voltage range are determined according to a pre-acquired corresponding relations among gate-source voltage, drain-source voltage and the cutoff voltage range.

3. The method of claim 1, wherein the requirement is that the gate-source voltage needed for the transistor is within the current cutoff voltage range when the display panel is illuminated.

4. The method of claim 1, wherein obtaining an initial characteristic curve of the transistor comprises:
The initial characteristic curve of the transistor is simulated according to a characteristic test result of the transistor which is obtained in advance.

5. The method of claim 4, wherein the characteristic test result of the transistor obtained in advance is obtained when the display panel is under an array substrate test.

6. The method of claim 1, wherein performing aging process on the transistor according to the determined required gate-source voltage and drain-source voltage comprises:
determining a gate voltage, a source voltage, and a drain voltage required by the transistor according to the determined gate-source voltage and drain-source voltage required for the transistor;
applying the gate voltage, the source voltage, and the drain voltage required by the transistor to the transistor to performing aging process on the transistor.

7. A system for performing an aging process a transistor in a display panel, comprising:
an analysis sub-circuit configured to obtain an initial characteristic curve of the transistor; and to determine an initial cutoff voltage range of the transistor according to the obtained initial characteristic curve;
a voltage determining sub-circuit configured to determine a gate-source voltage and a drain-source voltage required by the transistor according to the initial cutoff voltage range, so as to increase an cutoff voltage range of the transistor; and
a test sub-circuit configured to perform aging process on the transistor according to the determined required gate-source voltage and drain-source voltage,
wherein said voltage determining sub-circuit is configured to:
a) determine a corresponding reference cutoff voltage range of the transistor according to the initial cutoff voltage range;
b) determine, with the reference cutoff voltage range as a target cutoff voltage range, a reference gate-source voltage and a reference drain-source voltage required for the transistor to reach the target cutoff voltage range;
c) obtain the current characteristic curve of the transistor after applying the reference gate-source voltage and the reference drain-source voltage to the transistor;
d) determine whether the obtained current characteristic curve of the transistor satisfies the requirement;
e) if the obtained current characteristic curve of the transistor does not satisfy the requirement, increase the reference cutoff voltage range, and use the increased reference cutoff voltage range as the target cutoff voltage range, repeating steps b)-d);
in the case where the current characteristic curve of the transistor satisfies the requirement, the reference gate-source voltage and the reference drain-source voltage when the requirement is satisfied are used as the gate-source voltage and the drain-source voltage required for the transistor.

8. The system of claim 7, wherein the voltage determining sub-circuit is configured to determine the reference gate-source voltage and the reference drain-source voltage required for the transistor to reach the target cutoff voltage range according to a pre-acquired corresponding relations among gate-source voltage, drain-source voltage and the cutoff voltage range.

9. The system of claim 7, wherein said requirement is
The gate-source voltage required for the transistor when the display panel is illuminated is within the current cutoff voltage range of the transistor.

10. The system of claim 7, wherein said analysis subcircuit is configured to:
Simulate the initial characteristic curve of the transistor according to a characteristic test result of the transistor obtained in advance.

11. The system of claim 10, wherein the characteristic test result of the transistor obtained in advance is obtained when an array substrate test is performed on the display panel.

12. The system of claim 7, wherein the test subcircuit is configured to:
determine a gate voltage, a source voltage, and a drain voltage required by the transistor according to the determined gate-source voltage and drain-source voltage required for the transistor;
a gate voltage, a source voltage, and a drain voltage required for the transistor are applied to the transistor to performing aging process on the transistor.

* * * * *